(12) United States Patent
Kodama et al.

(10) Patent No.: US 8,319,419 B2
(45) Date of Patent: Nov. 27, 2012

(54) ORGANIC EL DISPLAY APPARATUS

(75) Inventors: Mitsufumi Kodama, Tokyo (JP);
Keisuke Watanabe, Tokyo (JP);
Daisuke Takeuchi, Tokyo (JP); Yuuki Aburakawa, Tokyo (JP)

(73) Assignee: Futaba Corporation, Mobara (JP)

( * ) Notice: Subject to any disclaimer, the term of this patent is extended or adjusted under 35 U.S.C. 154(b) by 166 days.

(21) Appl. No.: 12/813,132

(22) Filed: Jun. 10, 2010

(65) Prior Publication Data

US 2010/0314616 A1   Dec. 16, 2010

(30) Foreign Application Priority Data

Jun. 16, 2009 (JP) ................................. 2009-143302
Mar. 30, 2010 (JP) ................................. 2010-077525

(51) Int. Cl.
*H01L 51/52* (2006.01)
*H01L 51/50* (2006.01)
(52) U.S. Cl. ......... 313/503; 313/501; 313/506; 313/509
(58) Field of Classification Search ........... 313/500–512
See application file for complete search history.

(56) References Cited

U.S. PATENT DOCUMENTS

| 6,356,032 B1 * | 3/2002 | Suzuki et al. ................. | 313/504 |
| 6,882,102 B2 * | 4/2005 | Yamazaki ..................... | 313/504 |
| 6,894,432 B2 * | 5/2005 | Fujieda et al. ................ | 313/506 |
| 7,193,360 B2 * | 3/2007 | Seki ............................. | 313/504 |
| 7,449,833 B2 * | 11/2008 | Kobayashi .................... | 313/506 |
| 7,868,543 B2 * | 1/2011 | Kobayashi .................... | 313/506 |

FOREIGN PATENT DOCUMENTS

| JP | 8-185984 | 7/1996 |
| JP | 9-148074 | 6/1997 |
| JP | 10-294182 | 11/1998 |
| JP | 2000-243558 | 9/2000 |
| JP | 2001-148292 | 5/2001 |
| JP | 2002-289362 | 10/2002 |
| JP | 2002-334792 | 11/2002 |
| JP | 2004-186001 | 7/2004 |
| JP | 2004-303698 A | 10/2004 |

(Continued)

OTHER PUBLICATIONS

Japanese Office Action issued Jan. 5, 2011, in Patent Application No. 2010-077525.

(Continued)

*Primary Examiner* — Mariceli Santiago
(74) *Attorney, Agent, or Firm* — Oblon, Spivak, McClelland, Maier & Neustadt, L.L.P.

(57) ABSTRACT

A display apparatus comprises a display unit which has a plurality of organic EL elements two-dimensionally arranged to define pixels. Each organic EL element comprises a first electrode, an organic EL layer, and a second electrode laminated in order on an optically transparent substrate. One of the first electrode and second electrode is an optically transparent electrode, while the other is a non-optically transparent electrode. The non-optically transparent electrode is disposed to exist only in part of each pixel, as viewed from vertically above (for example, the width of the electrode is made smaller than the width of a pixel). In this way, the display unit can transmit light through portions of the pixels in which the non-optically transparent electrodes are not disposed. Preferably, the non-optically transparent electrode includes a mirror surface opposite to the organic EL layer.

13 Claims, 5 Drawing Sheets

FOREIGN PATENT DOCUMENTS

| | | |
|---|---|---|
| JP | 2004-355813 | 12/2004 |
| JP | 2005-108672 | 4/2005 |
| JP | 2006-19142 | 1/2006 |
| JP | 2006-234963 | 9/2006 |
| JP | 2008-46581 | 2/2008 |
| JP | 2008041341 A * | 2/2008 |
| JP | 2008-77991 A | 4/2008 |
| JP | 2009-71288 A | 4/2009 |

OTHER PUBLICATIONS

Japanese Office Action issued on May 11, 2011 in corresponding Japanese Application No. 2010-077525.

* cited by examiner

ORGANIC EL DISPLAY APPARATUS

BACKGROUND OF THE INVENTION

The present invention relates to an organic EL display apparatus, and more particularly, to a see-through display apparatus which permits light to pass through an image display area of the display apparatus.

Organic electro-luminescence (hereinafter called "organic EL") displays which make use of a light emitting phenomenon of organic substance have been progressively developed in recent years as candidates for the next generation by virtue of their advantageous features over liquid crystal displays and plasma displays, including a higher image quality, increasingly more potential reduction in thickness, higher luminance, higher definition, lower power consumption, and the like. Organic EL displays have been commercially available for displays intended for use in a variety of electronic devices, for example, a television set, a car navigation system, a portable terminal, and the like.

Such an organic EL display comprises a display screen which is constructed by forming a light emitting element (organic EL element) so as to sandwich an organic substance, which serves as a light emitter, between both negative and positive electrodes, and arranging a large number of light emitting elements over a two-dimensional plane as pixels.

Also, a transmission-type display (see-through display) can also be implemented if organic EL elements are used. For example, the transmission-type display allows a user to observe an image produced on a back side of a screen from a front side of the screen, or a see-through display may be overlaid on a variety of indicators such as an instrument panel (car equipped meters) of an automobile, such that the user is allowed to switch a front-side image provided by the see-through display to the indicators behind the display, and vice versa for viewing a desired one (see, for example, Patent Document 4 listed below). In this way, the organic EL see-through displays are expected to provide a variety of use forms different from conventional displays which can simply irradiate light from a screen to display an image, and have the capabilities to expand functions and designing potential provided by the displays.

Such organic EL displays have been disclosed by the following Patent Documents, and Patent Documents 4-8 in particular are directed to see-through displays.

Patent Document 1: JP-A-9-148074 (Japanese Patent No. 2770013);
Patent Document 2: JP-A-8-185984 (Japanese Patent No. 3560375);
Patent Document 3: JP-A-10-294182;
Patent Document 4: JP-A-2001-148292;
Patent Document 5: JP-A-2002-289362;
Patent Document 6: JP-A-2002-334792;
Patent Document 7: JP-A-2005-108672;
Patent Document 8: JP-A-2006-234963.

SUMMARY OF THE INVENTION

Conventionally, transmission-type organic EL displays have been predominantly implemented by a method which relies on a transparent electrically conductive film for use in constructing anodes and cathodes. This method has achieved a relatively high display quality when a display is driven in accordance with an active matrix driving mode.

However, this method implies the following problems when employing a passive matrix driving mode which is advantageous from a viewpoint of cost, and has not ever successfully provided a satisfactory see-through display.

(1) A first problem lies in that the transparent electrodes cannot generally exhibit both a sufficiently high transmissivity and a sufficiently low sheet resistance as required by a passive matrix see-through display. With the use of the passive matrix display mode, at least one of anode and cathode electrodes must have a low resistance. This is because one electrode (generally, the cathode) serves as a common electrode for performing a progressive scanning drive.

However, as the common electrode is increased in transmissivity, its line resistance is also increased, which can cause variations in luminance that results in non-uniform luminance over a display screen, and cross-talk which presents banded brightness changes depending on contents displayed on the display, thus resulting in a significantly exacerbated display quality. For overcoming this problem, a sufficiently low resistance (a preferable sheet resistance is substantially $1\Omega/\square$ or less) is required. Alternatively, an organic EL element may be designed to emit light at higher brightness with a smaller current even without reducing the resistance of the electrodes, but it is difficult in the present state of the art to design an organic EL material which achieves a high luminance with such a small current.

(2) Alternatively, for reducing the line resistance, it is contemplated to increase the thickness of transparent electrodes, laminating an extremely thin layer of silver, which is a low-resistance metal, on the transparent electrodes, or mixing a low-resistance metal into transparent electrode layers, but any such idea is in a trade-off relationship with the transmissivity of the common electrode. Accordingly, the transmissivity becomes lower as the resistance is kept lower, while the resistance is inevitably increased as the transmissivity is increased, thus experiencing difficulties in simultaneously achieving both the image quality and characteristics unique to the see-through display.

(3) Further, when a low-resistance metal is laminated with the transparent electrodes or mixed into the same, an extremely thin low-resistance metal material or a trace of low-resistance metal material must be uniformly applied within the display screen. This is intended to make the transmissivity uniform over the display screen to prevent variations in transmissivity among different displays. The amount of the low-resistance metal material used in this event corresponds to the thickness of several or several tens of atom layers, but a difference of several atom layers has been found to result in a difference of transmissivity on the order of percent. Thus, extremely high technical difficulties are involved in the manufacturing, particularly in mass production.

In the aforementioned Patent Document 4 (JP-A-2001-148292), in turn, a cathode is functionally separated into a metal thin film layer capable of transmitting light and a thick film layer for ensuring a low line resistance, implemented in a partially stacked structure, where a see-through function is accomplished by disposing a thin film area formed of the thin film layer and a thick film area formed of the thick film layer within a pixel. In this structure, however, transmitted light must pass through the metal layer, even if it is a thin film area, so that the transmissivity cannot be expected to increase beyond a certain level. On top of this, since the cathode must be made in a multi-layer structure comprised of an optically transparent thin film layer and a low-resistance thick film layer, this structure poses a challenge of increased manufacturing cost.

As will be understood from the foregoing, conventional display structures imply difficulties in sufficiently providing both the features unique to the see-through display and the display quality and in mass producing such displays at a low cost.

Further, in a display which employs transparent electrodes for both an anode and a cathode (for example, see the aforementioned Patent Documents 5, 6 and the like), since light is radiated from both front and back surfaces of the display, this display cannot be utilized when one does not wish that displayed information leaks on the back side. Also, when the display is placed on the front surface of a car equipped meter in an automobile as described above, light radiated from the back side reflects off the meter to make it difficult for a user to view images on the display, and to give rise to malfunctions of devices and parts placed opposite to the back side of the display, depending on a situation where the display is installed. Thus, light radiated on the back side would cause several problems depending on particular use manners. Such problems can occur as well in the structure of the aforementioned Patent Document 4 (JP-A-2001-148292).

It is therefore an object of the present invention to provide a see-through organic EL display apparatus which is capable of solving a variety of problems as described above and achieving a high display quality without the need for a complicated element structure.

To solve the problems and achieve the object, an organic EL display apparatus according to the present invention comprises a plurality of organic EL elements each including a first electrode, an organic EL layer, and a second electrode laminated in order on an optically transparent supporting substrate, and a display unit comprised of the plurality of organic EL elements two-dimensionally arranged on the supporting substrate so as to define pixels. One of the first electrode and second electrode is an optically transparent electrode, while the other of the first electrode and the second electrode is a non-optically transparent electrode. The non-optically transparent electrode is disposed to only exist in part of each pixel as viewed from vertically above, such that light can be transmitted by the display unit through a portion within the pixel in which the non-optically transparent electrode is not disposed.

In the display apparatus of the present invention which employs the organic EL element for constituting each pixel on the display unit, the first electrode is disposed on the bottom surface of the organic EL layer (one of the front and back surfaces of the organic EL layer closer to the supporting substrate), and the second electrode is disposed on the top surface of the organic EL layer (one of the front and back surfaces of the organic EL layer farther away from the supporting substrate). One of the first and second electrode is made of an optically transparent material (hereinafter called the "optically transparent electrode" or "transparent electrode"), while the other is made of a non-optically transparent material (hereinafter called the "non-optically transparent electrode").

Then, the non-optical transparent electrode, which does not exhibit optically transparent properties, is not formed in each pixel such that it extends over the entire pixel, but is formed such that the non-optical transparent electrode is disposed only in part of the pixel. In this way, each pixel is optically transparent around the non-optically transparent electrode, so that light is transmitted by the display unit through this area around the non-optically transparent electrode within each pixel (hereinafter this area is called the "see-through area"), thus allowing the display apparatus of the present invention to have functions unique to a see-through display.

In the present invention, the optically transparent electrode is typically made of ITO (Indium Tin Oxide). However, the optically transparent electrode is not so limited, but may be made using another optically transparent conductive material, for example, IZO (Indium Zinc Oxide), tin oxide, zinc oxide, and the like.

On the other hand, the non-optically transparent electrode may be comprised of a single layer of a low-resistance metal or alloy thin film, or a plurality of layers of such materials, and may be made, for example, of a metal thin film of aluminum, silver, silver-magnesium alloy, calcium or the like. In the present invention, the transmissivity of light need not be taken into consideration for the non-optically transparent electrode, so that the electrode can be made of a low-resistance material, and moreover can be made with a desired thickness (large thickness). Consequently, the line resistance of the electrode can be kept low, and a high display quality can be achieved when this electrode is used, for example, as a common electrode.

The organic EL layer is not particularly limited in laminate structure or materials used therefor. For example, the organic EL layer may be constructed in a five-layer structure which comprises a hole injection layer, a hole transport layer, a light emitting layer, an electron transport layer, and an electron injection layer which are laminated in order, or may be constructed in a three-layer structure (including a hole transport layer, a light emitting layer, and an electron transport layer), where the transport layers also serve as respective injection layers. In addition, a variety of other structures can be employed for the organic EL element. While materials suitable for the respective layers are also described later by way of example in embodiments, these layers are not so limited, but a variety of materials can be used the layers.

In a conventional see-through display which employs organic EL elements, optically transparent properties have been ensured, for example, by using transparent electrodes (optically transparent electrodes) which are disposed on both sides of an organic EL layer. However, in such a display, the transparent electrodes can merely ensure a transmissivity of approximately 50-90% at most whichever contrivance is devoted for materials to be used. Contrary to this conventional see-through display, according to the display apparatus of the present invention, since no electrode exists in the see-through area on the surface of the organic EL layer on which the non-optically transparent electrode is disposed, the see-through area can be expected to contribute to improvements in light transmissivity by 10% to 50%, as compared with the aforementioned conventional see-through display.

Additionally, in the present invention, in regard to the see-through area, the optically transparent electrode (electrode disposed on the surface of the organic EL layer on the opposite side of the non-optically transparent electrode), as well as the non-optically transparent electrode, can be disposed not to occupy part of the see-through area. For example, transparent electrodes may be arranged with a wider gap interposed therebetween, or the width of the transparent electrode may be reduced in the see-through area. According to such a structure, since the see-through area is free from both the optically transparent electrode and non-optically transparent electrode, the light transmissivity can be further improved through the see-through area. Additionally, the display unit can also be improved in light transmissivity by increasing the see-through area in each pixel (the area occupied by the non-optically transparent electrode is reduced in a pixel).

Notably, as a larger see-through area is taken in each pixel, the display unit exhibits a correspondingly higher light transmissivity, however, such a larger see-through area will result in a reduction of an area in which the optically transparent electrode, organic EL layer, and non-optically transparent electrode are laminated, and which is involved in light emission (hereinafter called the "light emitting area"). As such, the size of the see-through area (area required to dispose the non-optically transparent electrode within a pixel) may be determined in accordance with a particular application, use mode, required specifications and the like of the display apparatus. In this way, the present invention advantageously has the abilities to freely and readily change the ratio of the see-through area to the light emitting area within a pixel, in other words, the transmissivity (degree of transparency) and brightness (luminance) of the display unit simply by changing the size of the non-optically transparent electrode (area occupied thereby within a pixel), and to flexibly meet specifications and requirements needed for the see-through display.

In this regard, in the present invention, the non-optically transparent electrode preferably occupies an area of 5% to 95% within the area of one pixel, as viewed from vertically above. Such a range or area is proposed for the following reason. When the non-optically transparent electrode occupies less than 5% of the pixel area, the display screen becomes dark (the display unit is reduced in luminance), whereas when the non-optically transparent electrode exceeds 95% of the pixel area, the display unit is reduced in light transmissivity, resulting in degraded functions as a see-through display, for example, a user can experience difficulties in viewing a display generated on the back side of the display, and the like.

Further, in the display apparatus of the present invention, the light emitting area is defined by only parts of the first electrode and second electrode which directly sandwich the organic EL layer, and one of these electrodes that sandwich the organic EL layer is a non-optically transparent electrode. Accordingly, a displayed image can be viewed only on one of the front and back surfaces of the display (display unit) (one of the front and back surfaces of the organic EL layer on which the optically transparent electrode is disposed, and this surface is hereinafter called the "front surface" or "display surface"). The display apparatus of the present invention can prevent inconveniences as mentioned above, for example, can prevent a leak of display light from the other surface of the display (one of the front and back surfaces of the organic EL layer on which the non-optically transparent electrode is disposed, and this surface is hereinafter called the "back surface") from affecting a displayed image generated on the back surface of the display.

A more specific structure of the display unit described above is typically configured in the following manner. The organic EL elements are arranged in a matrix form on the supporting substrate, and the pixel has a planar shape of square (square or rectangular). Also, a plurality of strip-shaped electrodes are provided to extend in parallel with one another with a predetermined interval spaced therebetween as the optically transparent electrodes and the non-optically transparent electrodes, respectively. These optically transparent electrode and non-optically transparent electrode intersect substantially at right angles within the pixel, as viewed from vertically above, and the non-optically transparent electrode is disposed to extend across a set of opposing sides of the pixel, and has a width smaller than the length of the side.

Further, in the present invention, the non-optically transparent electrode preferably includes a mirror surface opposite to the organic EL layer. This is intended to reflect light emitted from the organic EL layer by the mirror surface toward the optically transparent electrode (toward the front side of the display unit) to increase the luminance of the display unit.

When such a mirror surface is formed, the organic EL layer or the non-optically transparent electrode is preferably processed beforehand to planarize the surface thereof. This is intended to increase the smoothness of the mirror surface to improve the reflectivity. For example, when the second electrode laminated on the organic EL layer is a non-optically transparent electrode, the top surface of the organic EL layer (the surface opposite to the second electrode) has been planarized before the second electrode is deposited on the organic EL layer. Any specific method is not recommended for the planarization. For example, the transparent electrode beneath the organic EL layer may be planarized by mechanical/physical processing (for example, polishing), or the material for the transparent electrode may be deposited in an amorphous form. The planarization can also be carried out by using the type of material which can be liquified during the deposition of the thin film, such as electrically conductive polymer, for the organic EL layer on the transparent electrode.

On the other hand, when the first electrode disposed between the supporting substrate and the organic EL layer is a non-optically transparent electrode, the top surface (surface opposite to the organic EL layer) of the first electrode (non-optically transparent electrode) has been planarized before the organic EL layer is deposited on the first electrode. A specific method for the planarization may be similar to the foregoing method.

Further, the non-optically transparent electrode may be disposed to match with a pixel center line (hereinafter this line is called the "pixel center line") which connects the centers of a set of opposing sides of the pixel, as viewed from vertically above (from a direction orthogonal to the supporting substrate or display unit). By thus positioning the non-optically transparent electrode at the center of a pixel, even if the non-optically transparent electrode suffers from a shift in the laminate and is slightly displaced in position in a width direction of the electrode, it is possible to prevent variations in the area ratio of the see-through area to the light emitting area within a pixel. Consequently, a display apparatus can be fabricated to have precise transmissivity and luminance closer to design values, and the yield rate can be improved for the product.

Also, in the present invention, the organic EL display apparatus may comprise a plurality of the non-optically transparent electrodes for each pixel. When the non-optically transparent electrode which traverses each pixel is divided into a plurality of electrodes in this way, instead of being comprised of a single electrode, each of the non-optically transparent electrode can be reduced in line width without introducing an increase in electric resistance and a reduction in the amount of light emitted from the display unit (luminance), so that the existence of the non-optically transparent electrode can be made less conspicuous, and the light transmissivity (visibility at the back of the display unit) can be improved, when viewed as the overall display unit.

Also, in the present invention, the organic EL display apparatus preferably comprises an inter-layer insulating film laminated to be interposed between the first electrode and the organic EL layer. This is intended to avoid electric short-circuiting of adjoining pixels (first electrodes) with each other and to prevent cross-talk light emission (light emission not intended in adjoining pixels). Also, in addition to electrical insulating properties, the inter-layer insulating film is preferably optically transparent in order to increase the light transmissivity of the display unit. A material which can be used for such an inter-layer insulating film will be described later in Description of Embodiments. The inter-layer insulating film further has an opening in a region where the first electrode intersects with the second electrode, where the first electrode is brought into contact with the organic EL layer in the opening to form a light emitting area.

Further, in the present invention, the organic EL display apparatus may comprise a laminate laminated on the inter-layer insulating film and having a top surface higher than the top surface of the organic EL layer.

Conventionally, a diaphragm may be provided on the inter-layer insulating film for forming second electrodes (electrodes disposed on the top surface of the organic EL layer) in stripes (see FIG. 10, where the inter-layer insulating film is designated by reference numeral 24, and the diaphragm by reference numeral 25). This diaphragm, which is generally called an "element separation layer" or a "cathode diaphragm" or the like, is formed in stripes in parallel with a direction in which the second electrode, to be later formed, extends, where each diaphragm rises on the inter-layer insulating film and has a certain height, and has a top surface higher than the top surfaces of the organic EL layer and the second electrode formed on the organic EL layer. By thus providing such high diaphragms on the inter-layer insulating film, even if the material of the second electrodes is uniformly deposited on the display unit by vapor deposition or the like without using a stripe pattern mask, a difference in level created by the diaphragms can separate the second electrodes from one another to form a stripe-pattern second electrode between the diaphragms on a pixel-by-pixel basis.

On the other hand, in the present invention, the second electrode is formed using, for example, a stripe pattern mask (metal mask) as a typical method of forming the second electrode, so that the diaphragms as described above are not necessarily required. However, with the provision of a laminate which rises on the inter-layer insulating film like the diaphragms, the laminate provides a function of a spacer for defining a space between the pattern mask and the display apparatus (already formed layers) when cathodes are formed, thus making it possible to prevent already formed layers (for example, the organic EL layer) from being damaged by the mask used to form the second electrodes. Accordingly, in one implementation of the present invention, the display apparatus comprises a laminate (or spacer, if stated another way) laminated on the inter-layer insulating film and having a top surface higher than the top surface of the organic EL layer. Notably, this laminate (diaphragm/spacer) is preferably formed of an optically transparent material, like the inter-layer insulating film, in order to increase the light transmissivity of the display unit.

Alternatively, the laminate (spacer) on the inter-layer insulating film may be a prismatic structure, such as a cylinder, a column, or the like, instead of the diaphragm structure. In this event, since the laminate can be made to have a minimally required size for supporting the pattern mask, even if the light transmissivity of the laminate is not sufficiently high, the display is less damaged in light transmissivity, and the laminate is less restricted in selecting a material therefor. Also, when such a prismatic structure is employed as the laminate on the inter-layer insulating film, an electrically conductive material can be used as well. When this prismatic structure is designed to have a diameter or a width substantially equal to its height, the structure will substantially never be fractured due to a contact with the pattern mask. However, since the fracture depends on the strength of a used material and a force with which the pattern mask comes into contact with the prismatic structure, the ratio of the diameter or width of the prismatic structure to the height of the same may be set as appropriate to a value corresponding to the strength of a used material and a force with which the pattern mask comes into contact with the prismatic structure. Also, while the display can be more readily improved in light transmissivity as the prismatic structures are placed at a lower density, the density of placement required to prevent a contact with the pattern mask varies depending on distortions of the pattern mask and a force with which the pattern mask comes into contact with the prismatic structure, so that the density at which the prismatic structures are placed may be determined to ensure a highest possible light transmissivity in accordance with a used mask. Further, from a viewpoint of strength, the prismatic structure preferably has a cross-sectional shape which is larger/wider toward the supporting substrate, and smaller/narrower away from the supporting substrate.

The display apparatus of the present invention may further comprise a sealing plate fixed to the supporting substrate to cover the display unit. In this event, the sealing plate is formed of an optically transparent material such as glass, resin or the like.

Instead of or in addition to the sealing plate, the display apparatus may also comprise a sealing thin film for covering the display unit. This sealing thin film is optically transparent, and is capable of blocking or restraining moisture from invading into the display unit. With the provision of such a film, the display apparatus can eliminate a desiccant which has been conventionally provided for removing moisture, and can be correspondingly reduced in size. While the sealing thin film is not particularly limited in material or structure, the sealing thin film can be a single-layer film or a laminate film comprised of a plurality of laminated films which mainly contain, for example, one or more of silicon oxide, silicon oxynitride, silicon nitride, silicon oxycarbide, and aluminum oxide. The thickness of the sealing thin film may be, for example, in a range of approximately 0.3 to 10 μm. Also, these sealing thin film may contain 10% or less of hydrogen.

Also, in the present invention, the organic EL display apparatus may further comprise another display means on the back side of the display unit (behind the back of the display unit), i.e, display means capable of producing a display different from a display produced by the display unit on the back surface of the display unit, and light from this display means (light radiated from the display means, or light reflected by the display means) is passed through the see-through area (portion of a pixel in which the non-optically transparent electrode is not disposed) so that this light can be viewed from the front side of the display unit.

Accordingly, such a display apparatus can switch an image on the see-through organic EL display disposed on the front side to an image displayed by the display means disposed on the back side, and vice versa for displaying a selected image, or can display a combination of both images. While the display means includes a variety of displays (organic EL display, a liquid crystal display, and the like) capable of displaying images, by way of example, the display means may also include, other than such displays, an illumination device for simply illuminating light, or a variety of indications which do not per se emit light (visible by light reflected therefrom). When the display means comprises an illumination device, the illumination device may be, for example, a light emitter capable of radiating light in various colors. In this event, the light emitted from the light emitter can be combined with an image generated by the see-through organic EL display disposed on the front side to implement a display which can change a background color in various manners.

Thus, the present invention can provide a see-through organic EL display apparatus which achieves a high display quality without the need for a complicated organic EL element structure.

Other objects, features, and advantages of the present invention will be made more apparent from the following description of embodiments of the present invention which is made in connection with the drawings. In the drawings, the same reference numerals indicate the same or corresponding parts.

DESCRIPTION OF THE EMBODIMENTS

First Embodiment

Figure 1:
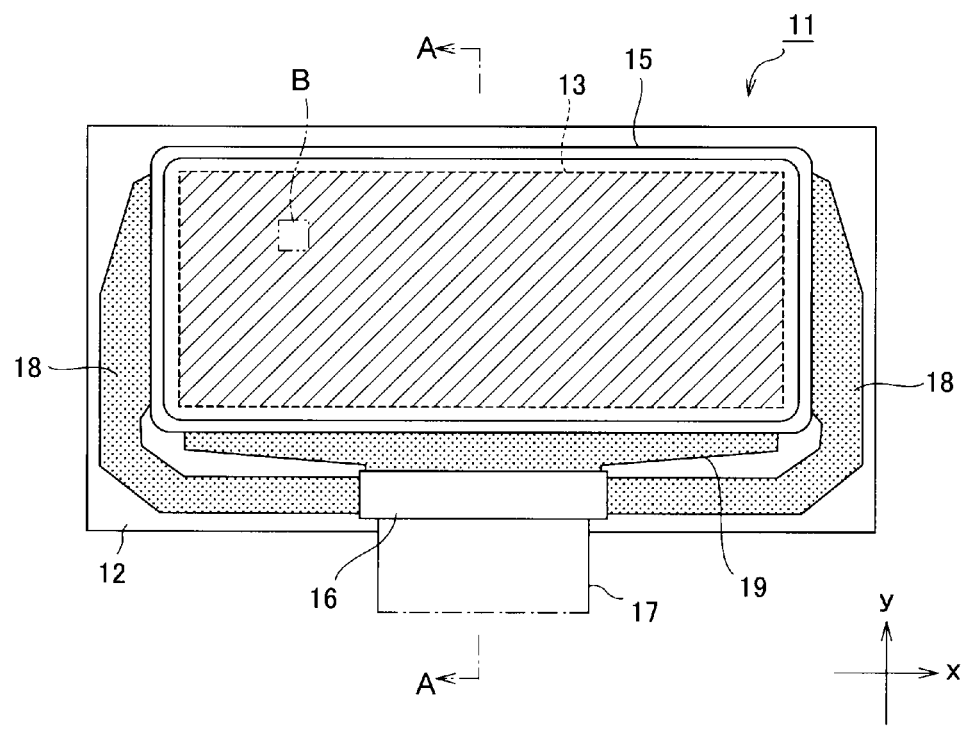
FIG. 1 is a top plan view schematically showing an organic EL display apparatus according to a first embodiment of the present invention.
Figure 2:
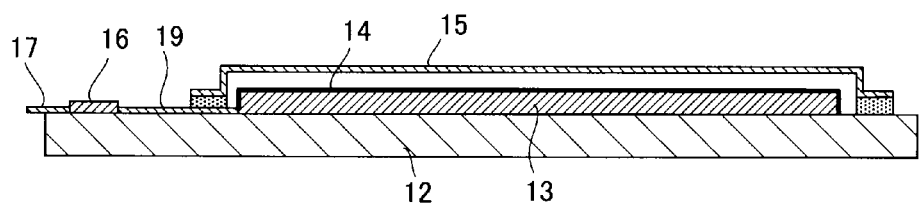
FIG. 2 is a diagram showing a cross-sectional structure (taken along A-A) of the organic EL display apparatus according to the first embodiment.

As shown in FIGS. 1 and 2, an organic EL display apparatus 11 according to a first embodiment of the present invention comprises an optically transparent, flat glass substrate 12 (hereinafter simply called the "substrate" in some cases); an organic EL display unit 13 (hereinafter called the "display unit") formed on the surface of the glass substrate 12; a sealing thin film 14 for covering the display unit 13; a sealing plate 15 for again covering and sealing the display unit 13 covered with the sealing thin film 14; an integrated circuit (IC) 16 for driving the display unit 13; and a flexible printed circuit board (FPC) 17 connected to the IC 16.

The display unit 13 comprises a plurality of organic EL elements, which provide pixels, arranged on a two-dimensional plane, i.e, in the horizontal direction (x-direction in FIG. 1) and in the vertical direction (y-direction in FIG. 1) in a matrix shape such that images can be displayed thereon. As shown in enlarged views in FIGS. 3 and 4, the display unit 13 is formed by sequentially laminating an anode (transparent electrode made, for example, of ITO) 21, an inter-layer insulating film 24 for electrically insulating adjoining anodes 21 from each other, an element separation layer (diaphragm/laminate) 25, an organic EL layer 22 including a light emitting layer, and a cathode 23 on the glass substrate 11 in this order.

Figure 3:
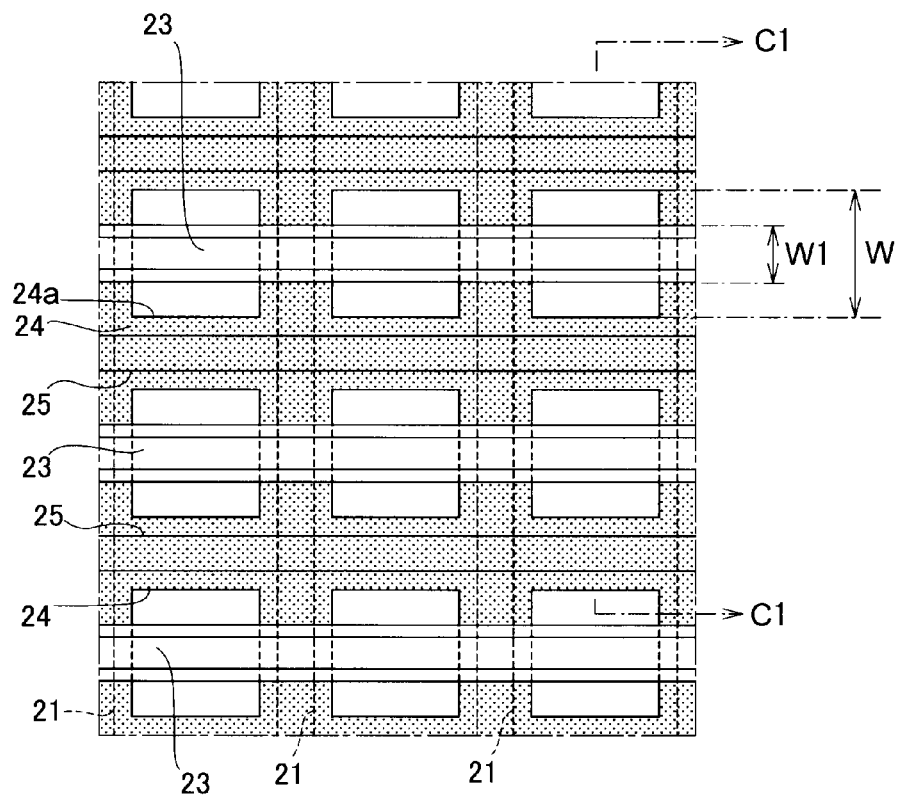
FIG. 3 is a top plan view schematically showing a portion (portion B in FIG. 1) of the organic EL display apparatus according to the first embodiment in enlarged view.
Figure 4:
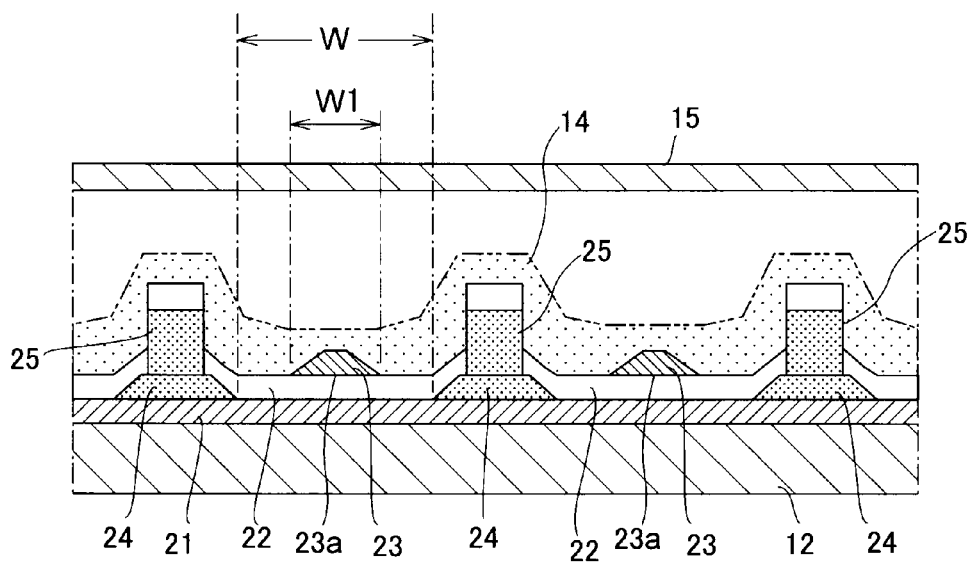
FIG. 4 is a diagram schematically showing a cross-sectional structure (taken along C1-C1 in FIG. 3) of the organic EL display apparatus according to the first embodiment.

Notably, the display apparatus 11 in this embodiment is of a bottom emission type for emitting display light downward in FIGS. 2 and 4 (toward the glass substrate 12), and the display unit 13 is driven by a passive matrix method. Also, while the overall display unit is formed in a landscape orientation in this illustrative example, the display unit may be in a portrait orientation (a dimension in a y-axis direction is larger than a dimension in an x-axis direction), or in a square shape which is substantially equal in vertical and horizontal dimensions. Also, in FIG. 3, the organic EL layer 22, sealing thin film 14, and sealing plate 15 are omitted in the illustration (they are also omitted in FIGS. 7 and 9, later described).

The anodes 21 are formed of ITO. The anodes 21 are arranged in parallel with one another in stripes on the substrate 12, and are provided in a number corresponding to the number of pixels. A lead wire 19 is connected to each end of these anodes 21, and these lead wires 19 are disposed such that they are drawn out of the display unit 13 (a sealed space defined by the sealing plate 15), and are connected to the IC 16 for driving. In regard to the cathodes 23, later described, a lead wire 18 is connected to each end of the cathodes 23 (end of the display unit 13), drawn out of the display unit 13 (the sealed space defined by the sealing plate 15), and electrically connected to the IC 16 in a similar manner.

The inter-layer insulating film 24 is preferably optically transparent, has a high transmissivity in a visible light region (the transmissivity is, for example, 80% or more in the visible light region), and is as water-clear as possible. This is intended to make optically transparent not only a surrounding region of the cathodes 23, later described, but also a region formed with the inter-layer insulating film 24 to enhance functions unique to a see-through display. Also, from an electrical viewpoint, the inter-layer insulating film 24 is assumed to have a resistance to such an extent or more that a current leaking between adjoining anodes 21 does not affect the display quality. Such an inter-layer insulating film 24 can be formed specifically of an inorganic compound mainly containing silicon oxide, silicon oxynitride, silicon nitride, aluminum oxide, tantalum oxide or the like, acrylic resin, novolak resin, polyimide resin, polycycloolefin resin and the like, by way of example. The inter-layer insulating film 24 has a pixel opening 24a which has a substantially square shape, as viewed from vertically above.

Further, in this embodiment, the element separation layer (diaphragm/laminate) 25 is disposed on the inter-layer insulating film 24. This is intended to prevent the organic EL layer 22 from being damaged by a metal mask during the formation of the cathodes 23. The element separation layer 25 has a top surface higher than the top surface of the organic EL layer 22 formed on the anodes 21, and is made of an insulating and optically transparent material as is the case with the inter-layer insulating film 24.

On the other hand, while the organic EL layer 22 may vary in its laminate structure as previously described, the organic EL layer 22 is made of an organic material which is optically transparent and substantially water-clear when it is deposited. This is intended to minimize the influence on light which is transmitted by the display unit 13 to enhance the functions unique to a see-through display. Such an organic EL layer 22 can be formed, for example, by depositing α-NPD (Bis[N-(1-naphthyl)-N-pheny]benzidine/hole transport layer), Alq3

(tris (8-hydroxyquinoline) aluminum/light emitting layer) doped with rubrene, Alq3 (electron transport layer), and lithium fluoride (electron injection layer) on the anodes 21 in this order.

Then, the cathodes 23 are disposed on the organic EL layer 22. The cathodes 23 are arranged in parallel with one another in stripes, in a manner similar to the anodes 21, in a number corresponding to the number of pixels, in such a manner that each cathode 23 intersects substantially perpendicularly to the anodes 21, as viewed from vertically above. Also, in this embodiment, each of the cathodes 23 has a width W1 smaller than a pixel width W, and is disposed on the top surface of the organic EL layer 22 such that it traverses a substantially central position of a pixel area (pixel opening 24a) and sandwiches the organic EL layer 22 together with the anode 21. This portion sandwiched by the cathode 23 and the anode 21 serves as a light emitting area.

The cathode 23 has a bottom surface 23a (surface closer to the organic EL layer 22 or closer to the display screen of the display unit) which is made to be a mirror surface. Also, for increasing the reflectivity of the mirror surface, the underlying organic EL layer 22 is preferably processed to planarize its surface before the cathodes 23 are formed. This planarization process may be performed using a method as mentioned before. As to a suitable material, the cathodes 23 may be made, for example, of aluminum, silver, silver/magnesium alloy, or the like.

Figure 5:
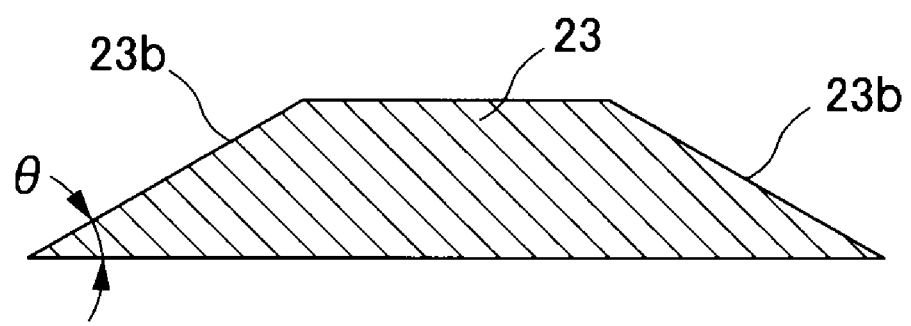
FIG. 5 is a cross-sectional view showing a cathode employed in the organic EL display apparatus according to the first embodiment in an enlarged view.

The cathode 23 is formed in an inclined cross section such that its thickness is reduced more from the center to the edge of the pattern, in order to provide a good coverage for forming the sealing thin film 14 (later described). The cathode 23 having such a shape is shown in FIGS. 4 and 5, where the cathode 23 has a trapezoidal cross section, and is formed with inclined surfaces (divergent surfaces) 23b which decline from both the left and right edges of the top surface of the cathode 23 toward the top surface of the organic EL layer 22. These inclined surfaces 23b on both sides of the cathode 23 are preferably as smooth as possible from a viewpoint of the coverage by the sealing thin film 14. Particularly, at the edge of the pattern which defines the boundary with the top surface of the organic EL layer 22, the inclined surface 23b preferably has an inclination angle θ of 30° or less and more preferably of 1° or less.

Figure 6:
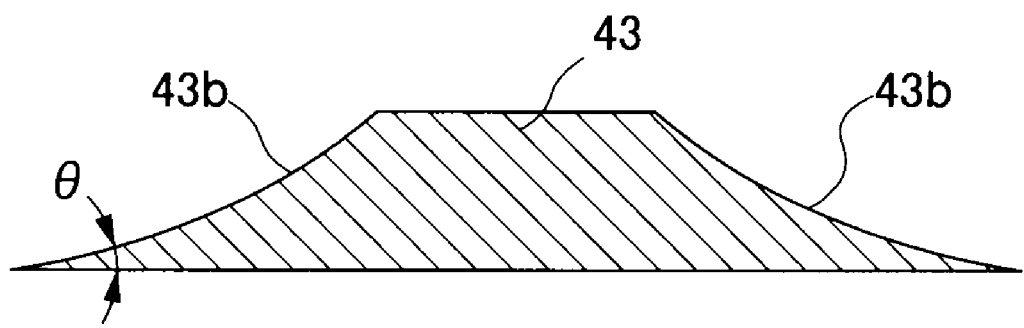
FIG. 6 is an enlarged cross-sectional view showing another exemplary structure of a cathode employed in the organic EL display apparatus according to the first embodiment in an enlarged view.

Additionally, the inclined surface 23b need not be flat, but may be replaced with a curved (downwardly concave) surface 43b, for example, like a cathode 43 shown in FIG. 6. With the cathode 43 having such curved inclined surfaces 43b, the cathode 43 can be increased in thickness at the center to reduce its electric resistance, and simultaneously, the inclination angle θ at the edge of the cathode 43 can be reduced to a very small angle to allow the sealing thin film 14 to provide a better coverage.

On the other hand, around the cathode 23, the substrate 12, anode 21, organic EL layer 22, sealing thin film 14 (details of which are later described), and sealing plate 15 are all optically transparent, so that they provide the see-through area which can transmit light. The ratio of the see-through area to the light emitting area, in which the cathode 23 is disposed, may be determined depending on a particular application, use mode, and the like of the display apparatus 11. In this way, the display apparatus 11 according to this embodiment is advantageous in that the transmissivity of the display apparatus 11 can be freely and easily set by simply changing the width dimension W1 of the cathode 23. Also, in the light emitting area, since the cathode 23 is not optically transparent, display light will not leak on the back side of the display apparatus 11 (upward in FIG. 4), and emitted light is reflected by the bottom surface 23a of the cathode 23, which is a mirror surface, toward the display screen, thus making it possible to provide a high-luminance display apparatus.

The sealing thin film 14 is disposed on the cathodes 23. The sealing thin film 14, which is made of an optically transparent material, is formed to cover the entirety of the display unit 13. As to a suitable material, the sealing thin film 14 can be made, for example, of silicon oxide, silicon oxynitride or the like. Additionally, for increasing moisture barrier properties, polysilazane or the like can be coated on a film of silicon oxide or silicon oxynitride to made the sealing thin film 14 in a multi-film structure.

Then, the sealing plate 15 is disposed to again cover the display unit 13 on which the sealing thin film 14 has been formed. This sealing plate 15 can be formed of optically transparent glass or resin, and is adhered to the glass substrate 12, for example, by an adhesive made of an acrylic-based or epoxy-based ultraviolet-setting resin or the like. Notably, when using the sealing plate 15 made of a resin material, the sealing plate 15 is preferably formed on at least one side thereof with a thin film which mainly contains silicon oxide, silicon oxynitride, alumina or the like and has a moisture transmission restriction (or prevention) effect.

Alternatively, as another example of the sealing structure, a glass plate formed with a recess by etching, for example, may be adhered to the cathodes 23 after they have been deposited, and in this event, a desiccant may be placed at a position which is not visible from the outside, or a transparent desiccant may be coated into the recess. However, such a sealing structure entails a problem of an increase in the size of the display apparatus due to requirements for ensuring a region for placing the desiccant. In contrast, according to the aforementioned sealing structure of the embodiment which comprises the sealing thin film 14, no region is required for placing the desiccant, and the display apparatus 11 can be advantageously reduced in size for that region.

Second Embodiment

Figure 7:
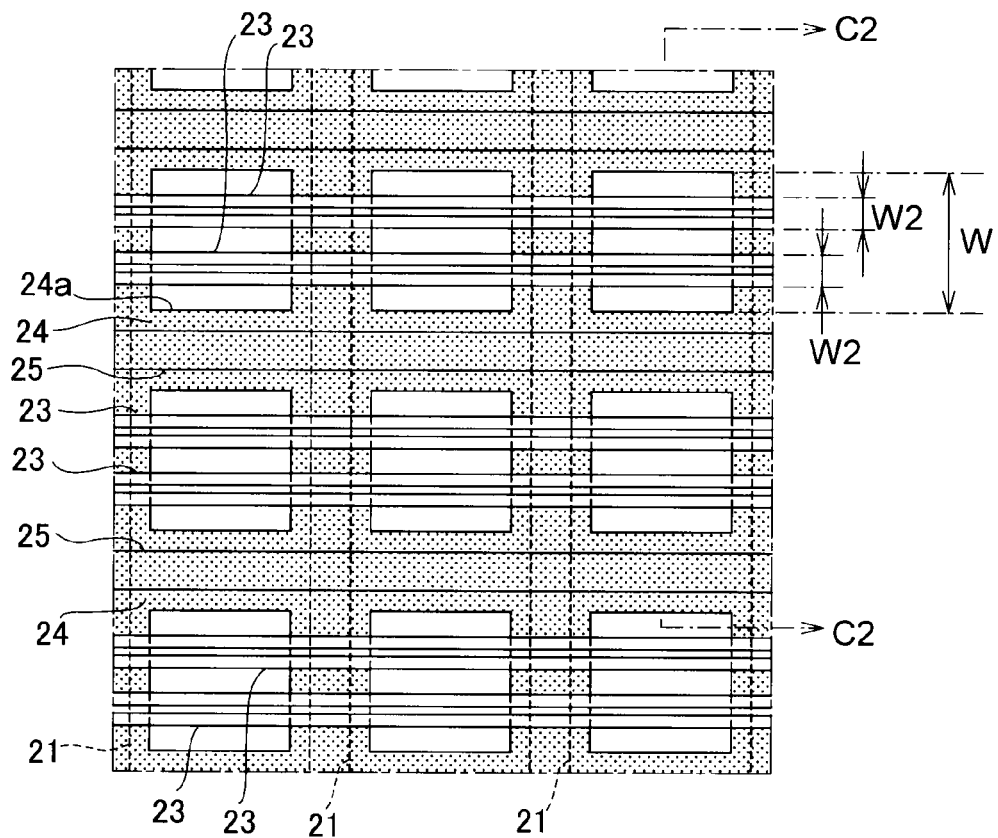
FIG. 7 is a top plan view showing an organic EL display apparatus according to a second embodiment of the present invention in a manner similar to FIG. 3.

An organic EL display apparatus according to a second embodiment of the present invention will be described with reference to FIGS. 7 and 8. FIG. 7 is a top plan view corresponding to the aforementioned FIG. 3, and FIG. 8 is a cross-sectional view corresponding to FIG. 4.

Figure 8:
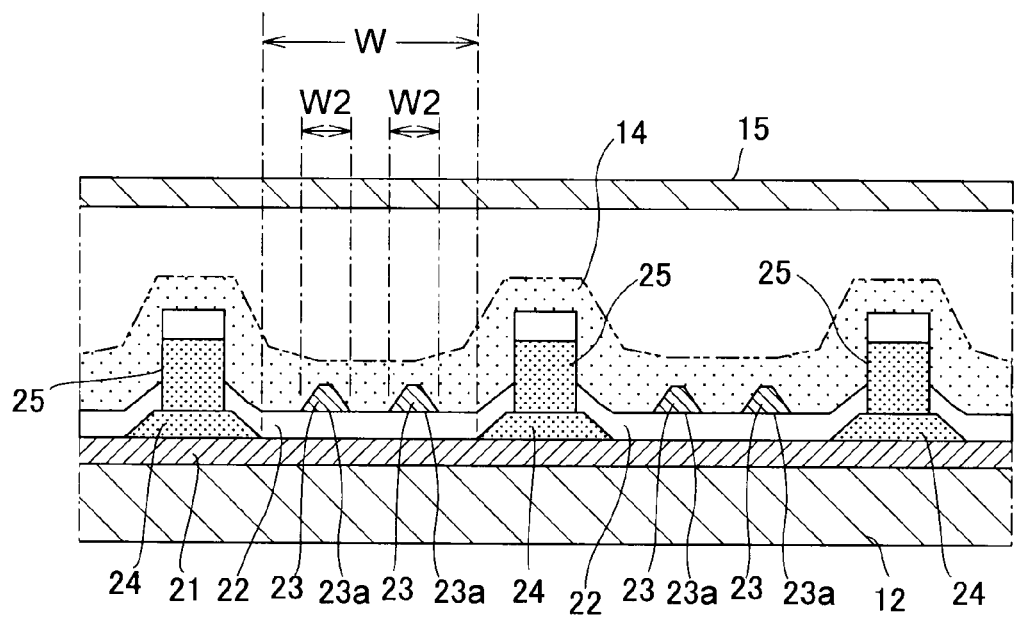
FIG. 8 is a diagram schematically showing a cross-sectional structure (taken along C2-C2 in FIG. 7) of the organic EL display apparatus according to the second embodiment in a manner similar to FIG. 4.

As shown in FIGS. 7 and 8, the display apparatus according to the second embodiment differs from the apparatus of the first embodiment only in the structure of cathodes. Specifically, in the first embodiment, a cathode is formed of one electrode on a pixel-by-pixel basis, whereas in the second embodiment, a cathode which passes through each pixel is formed of two electrodes. More specifically, two cathodes 23 pass through each pixel, where these two electrodes 23 have a width W2 which is smaller than the width W1 of the cathode 23 in the first embodiment.

By thus forming the cathode 23 which traverses each pixel using a plurality of elongated separate electrodes 23, instead of using a single electrode, the existence of the cathodes can be made inconspicuous to improve the visibility behind the display unit without increasing the electric resistance, or without reducing the amount of emitted light (luminance). While each cathode is divided such that two each of elongated electrodes (cathodes) 23 pass through each pixel in this embodiment, the number of such electrodes is not limited to two but can be three or more.

Figure 9:
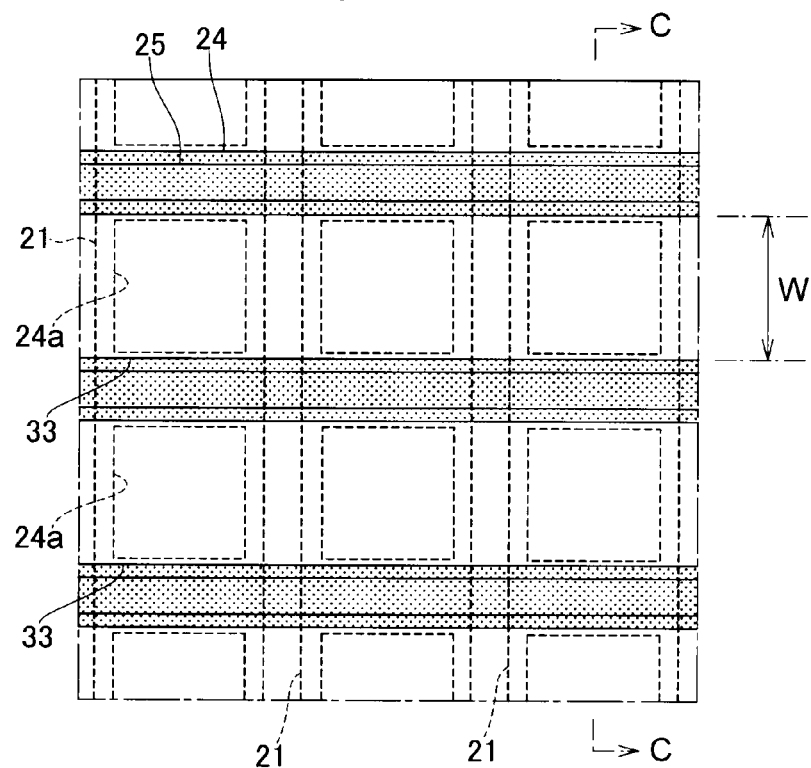
FIG. 9 is a top plan view showing an example of a conventional organic EL display apparatus.
Figure 10:
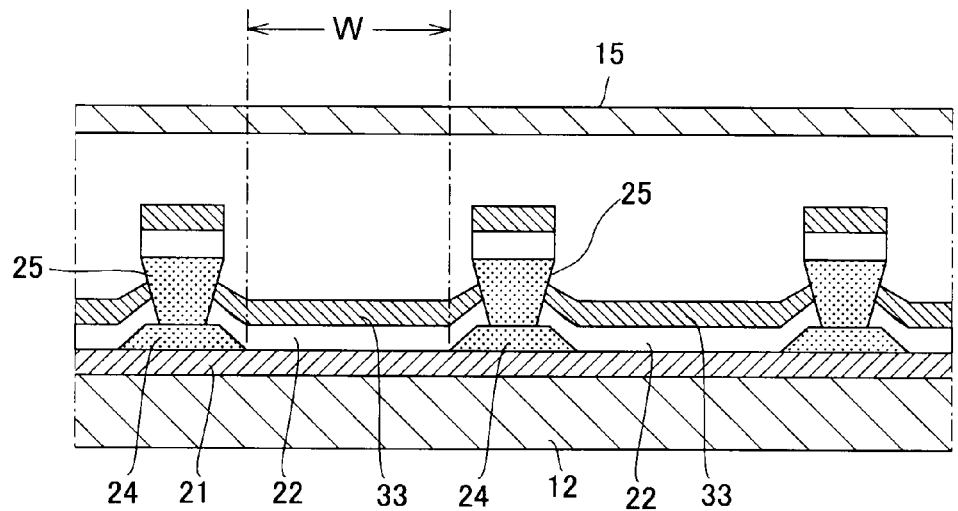
FIG. 10 is a diagram schematically showing a cross-sectional structure (taken along C-C in FIG. 9) of the conventional organic EL display apparatus.

For purposes of comparison with this embodiment, FIGS. 9 and 10 show an example of a conventional organic EL display apparatus. FIG. 9 is a top plan view corresponding to the aforementioned FIG. 3, and FIG. 10 is a cross-sectional view (taken along C-C in FIG. 9) corresponding to the aforementioned FIG. 4. As shown in these figures, in the structure of the conventional apparatus, light from the back side of the display (upward in FIG. 10) is blocked by cathodes 33 and cannot therefore be transmitted by a display unit. For modifying this display apparatus for use as a see-through display, the cathodes 33 must be replaced with transparent electrodes. In contrast, according to the foregoing embodiment of the present invention described above, a see-through display can be manufactured only through a simple change in design, i.e., a change in the widths W1, W2 of the cathodes 23 which are laminated on the top surface of the organic EL layer 22, as previously described, without requiring significant changes in design from a conventional apparatus.

Now, an exemplary process of manufacturing the display apparatus according to the embodiment will be described below.

A transparent electrode film is deposited in thickness of 100 nm on an optically transparent non-alkali glass substrate 12 for forming anodes (ITO) 21, and is patterned in strips by photolithography technologies (involving applying a resist, exposing and developing the resist through a mask pattern, and etching the electrode film into the electrodes). Also, metal wires are formed for use as signal lines and power supply lines as required. These metal wires are formed, for example, of molybdenum, molybdenum alloy, aluminum, aluminum alloy, titanium, titanium nitride, chromium, tungsten, tungsten alloy, silver, silver alloy, copper, copper alloy, gold or the like. Alternatively, the metal wires may have a laminated structure comprised of a plurality of laminated films made of these metals, and the metal wires can be disposed in such a manner that they are not visible from the outside while the display apparatus is in use.

Next, an inter-layer insulating film 24 is formed to cover at least a difference in level of ITO 21. The inter-layer insulating film 24 may be formed in two or more layers rather than in only one layer. Further, an element separation layer (laminate) 25 is formed on the inter-layer insulating film 24. This element separation layer 25 can be made to serve as a spacer for preventing organic EL elements from coming into direct contact with a metal mask which is used to deposit cathodes 23. For this purpose, the element separation layer 25 is formed in thickness ranging from 0.5 μm to 10 μm, by way of example.

Next, a metal mask is placed on the substrate 12 for defining a light emitting area, and an organic EL layer 22 is deposited through the metal mask. Specifically, α-NPD, Alq3 doped with rubrene, Alq3, and lithium fluoride (electron injection layer) are deposited on the ITO 21 in this order. Since cathodes 23 have not been disposed in this state, the entire light emitting area transmits light.

Further, another metal mask formed with interstices in the form of shade is placed on the foregoing metal mask, and aluminum is vapor deposited to form cathodes 23 of 100 nm thick. In this event, aluminum is deposited in interstices of the metal mask, so that cathodes 23 made of aluminum are deposited in a pattern which is inversion of the pattern of the metal mask. A portion deposited with the cathode 23 within a pixel serves as a light emitting area, and therefore does not transmit light. A portion of a pixel free from the cathode 23 still transmits light.

The cathode 23 has a resistance (sheet resistance) which is preferably 5Ω/□ or less, and more preferably 1Ω/□ or less. This is because a passive matrix type display is driven by progressive scanning, as described above, and the cathode 23 is used as a common electrode in the embodiment as well.

Here, though depending on how the display is used, a current generally flows through the common electrode on the order of several mA to several hundreds of mA. The ratio of the length of the electrode to the width W1 of the electrode is multiplied by the sheet resistance to derive the resistance of the electrode 23. A voltage drop due to this resistance appears as a power loss, and therefore is preferably as small as possible. Accordingly, the sheet resistance of the cathode 23 should be as small as possible. Though depending on the resolution of a display to be fabricated, tolerance limits to the voltage drop due to the resistance are approximately one to two volts. Thus, an appropriate product designing can be achieved to allow the voltage drop to fall within the tolerance limits if the sheet resistance is set to the aforementioned value. For reference, when an aluminum thin film (cathodes 23) is formed in thickness of 100 nm by vapor deposition in the manner described above, the aluminum thin film exhibits a sheet resistance on the order of 0.3 to 0.4Ω/□. Also, this aluminum thin film can reduce the intensity of incident light to $1/1000$ or less, so that the cathodes 23 can provide a light blocking effect required by the present invention.

When the aluminum thin film is vapor deposited, the glass substrate 12 is rotated to apply aluminum to the substrate 12 from a variety of angles. In this way, the cathodes 23, 43 can be formed to have inclined surfaces from the edges of the top surface, as described above. The inclination angle θ at the edge of the pattern is preferably in a range of 0.1° to 30°. When the inclination angle θ at the edge of the pattern of the cathode 23, 43 is chosen to be 30° or less, sealing thin film 14 completely covers the pattern edges to prevent defects due to failed coverage (occurrence of dark spots due to invasion of moisture).

Then, a transparent insulating film (sealing thin film 14) made of silicon oxide or silicon oxynitride is further formed on the cathodes 23, and a sealing plate 15 is adhered to seal the display unit 13. Subsequently, a driving circuit (IC) 16 is electrically connected to the display unit 13, thus completing the display apparatus 11.

While some embodiments of the present invention have been described above, it should be apparent to those skilled in the art that the present invention is not limited to the embodiments but can be modified in various manner without departing from the spirit and scope of the invention defined by the appended claims.

For example, in the foregoing embodiments, the anodes 21 (optically transparent electrodes) are disposed on one of two sides of the organic EL layer 22 closer to the glass substrate 12, while the cathodes 23 (non-optically transparent electrodes) are deposited on the other side of the organic EL layer 22 closer to the sealing thin film 14. Alternatively, contrary to the foregoing, the cathodes 23 (non-optically transparent electrodes) may be disposed on the side of the organic EL layer 22 closer to the glass substrate 12, while the anodes 21 (optically transparent electrodes) may be disposed on the other side closer to the sealing thin film 14, respectively. In this event, the resulting display apparatus is of a top emission type which emits display light through the sealing thin film 14. Also, the display unit 13 may be driven by an active matrix method. Further, a variety of structures may be employed for the display unit 13 to such an extent that the set optical transparent properties are not damaged, other than the aforementioned embodiments, such as providing the organic EL layer 22 with a plurality of light emitting layers which differ in light emitting wavelength from one another, or with a polarizer plate, and the like.

What is claimed is:

1. An organic EL display apparatus comprising:
a plurality of organic EL elements each including, in order, a first electrode, an organic EL layer, and a second electrode laminated on an optically transparent supporting substrate; and
a display unit including a two-dimensional arrangement of said plurality of organic EL elements on said supporting substrate to define pixels,
wherein, for each organic EL element, one of said first electrode and said second electrode is an optically transparent electrode,
the other of said first electrode and said second electrode is a non-optically transparent electrode,
said non-optically transparent electrode is disposed to only exist in part of each pixel as viewed from vertically above,
no electrode for light-emitting except the non-optically transparent electrode is provided on a side of the organic EL layer on which the non-optically transparent electrode is disposed,
a background of the display unit is observable through a portion within the pixel in which said non-optically transparent electrode is not disposed,
said organic EL elements are arranged in a matrix form on said supporting substrate,
said pixel has a square planar shape,
said organic EL display apparatus includes a plurality of strip-shaped electrodes extending in parallel with one another with a predetermined interval spaced therebetween as said optically transparent electrodes and said non-optically transparent electrodes, respectively,
said optically transparent electrode and said non-optically transparent electrode intersect substantially at right angles within said pixel, as viewed from vertically above, and
said non-optically transparent electrode is disposed to extend across a set of opposing sides of said pixel, and has a width smaller than the length of the side.

2. The organic EL display apparatus according to claim 1, wherein said non-optically transparent electrode includes a mirror surface on a side opposite to said organic EL layer.

3. The organic EL display apparatus according to claim 2, wherein:
said second electrode is the non-optically transparent electrode, and
said organic EL layer includes a surface opposite to said second electrode, said surface being planarized before said second electrode is formed on said organic EL layer.

4. The organic EL display apparatus according to claim 2, wherein:
said first electrode is the non-optically transparent electrode, and
said first electrode includes a surface opposite to said organic EL layer, said surface being planarized before said organic EL layer is formed on said first electrode.

5. An organic EL display apparatus comprising:
a plurality of organic EL elements each including, in order, a first electrode, an organic EL layer, and a second electrode laminated on an optically transparent supporting substrate; and
a display unit including a two-dimensional arrangement of said plurality of organic EL elements on said supporting substrate to define pixels,
wherein, for each organic EL element, one of said first electrode and said second electrode is an optically transparent electrode,
the other of said first electrode and said second electrode is a non-optically transparent electrode,
said non-optically transparent electrode is disposed to only exist in part of each pixel as viewed from vertically above,
no electrode for light-emitting except the non-optically transparent electrode is provided on a side of the organic EL layer on which the non-optically transparent electrode is disposed,
a background of the display unit is observable through a portion within the pixel in which said non-optically transparent electrode is not disposed,
said non-optically transparent electrode includes a mirror surface on a side opposite to said organic EL layer.

6. The organic EL display apparatus according to claim 5, wherein:
said second electrode is the non-optically transparent electrode, and
said organic EL layer includes a surface opposite to said second electrode, said surface being planarized before said second electrode is formed on said organic EL layer.

7. The organic EL display apparatus according to claim 5, wherein:
said first electrode is the non-optically transparent electrode, and
said first electrode includes a surface opposite to said organic EL layer, said surface being planarized before said organic EL layer is formed on said first electrode.

8. An organic EL display apparatus comprising:
a plurality of organic EL elements each including, in order, a first electrode, an organic EL layer, and a second electrode laminated on an optically transparent supporting substrate; and
a display unit including a two-dimensional arrangement of said plurality of organic EL elements on said supporting substrate to define pixels,
wherein, for each organic EL element, one of said first electrode and said second electrode is an optically transparent electrode,
the other of said first electrode and said second electrode is a non-optically transparent electrode,
said non-optically transparent electrode is disposed to only exist in part of each pixel as viewed from vertically above,
no electrode for light-emitting except the non-optically transparent electrode is provided on a side of the organic EL layer on which the non-optically transparent electrode is disposed,
a background of the display unit is observable through a portion within the pixel in which said non-optically transparent electrode is not disposed,
said non-optically transparent electrode is disposed to match with a pixel center line which connects the centers of a set of opposing sides of said pixel, as viewed from vertically above.

9. An organic EL display apparatus comprising:
a plurality of organic EL elements each including, in order, a first electrode, an organic EL layer, and a second electrode laminated on an optically transparent supporting substrate; and
a display unit including a two-dimensional arrangement of said plurality of organic EL elements on said supporting substrate to define pixels,
wherein, for each organic EL element, one of said first electrode and said second electrode is an optically transparent electrode, the other of said first electrode and said second electrode is a non-optically transparent electrode, said non-optically transparent electrode is disposed to only exist in part of each pixel as viewed from vertically above, no electrode for light-emitting except the non-optically transparent electrode is provided on a side of the organic EL layer on which the non-optically transparent electrode is disposed, a background of the display unit is observable through a portion within the pixel in which said non-optically transparent electrode is not disposed, the organic EL display apparatus includes a plurality of said non-optically transparent electrodes for each pixel.

10. An organic EL display apparatus comprising:

a plurality of organic EL elements each including, in order, a first electrode, an organic EL layer, and a second electrode laminated on an optically transparent supporting substrate; and a display unit including a two-dimensional arrangement of said plurality of organic EL elements on said supporting substrate to define pixels, wherein, for each organic EL element, one of said first electrode and said second electrode is an optically transparent electrode, the other of said first electrode and said second electrode is a non-optically transparent electrode, said non-optically transparent electrode is disposed to only exist in part of each pixel as viewed from vertically above, no electrode for light-emitting except the non-optically transparent electrode is provided on a side of the organic EL layer on which the non-optically transparent electrode is disposed, a background of the display unit is observable through a portion within the pixel in which said non-optically transparent electrode is not disposed, the organic EL display apparatus includes an inter-layer insulating film laminated to be interposed between said first electrode and said organic EL layer, said inter-layer insulating film is optically transparent and includes an opening in a region where said first electrode intersects with said second electrode, said first electrode being brought into contact with said organic EL layer in said opening to form a light emitting area.

11. The organic EL display apparatus according to claim 10, further comprising:

a laminate laminated on said inter-layer insulating film and having a top surface higher than the top surface of said organic EL layer.

12. An organic EL display apparatus comprising:

a plurality of organic EL elements each including, in order, a first electrode, an organic EL layer, and a second electrode laminated on an optically transparent supporting substrate; and a display unit including a two-dimensional arrangement of said plurality of organic EL elements on said supporting substrate to define pixels, wherein, for each organic EL element, one of said first electrode and said second electrode is an optically transparent electrode, the other of said first electrode and said second electrode is a non-optically transparent electrode, said non-optically transparent electrode is disposed to only exist in part of each pixel as viewed from vertically above, no electrode for light-emitting except the non-optically transparent electrode is provided on a side of the organic EL layer on which the non-optically transparent electrode is disposed, a background of the display unit is observable through a portion within the pixel in which said non-optically transparent electrode is not disposed, said display unit includes a front surface closer to an image display side, and a back surface on an opposite side of said front surface, said apparatus further includes display means capable of producing a display different from a display produced by said display unit on the back surface of said display unit.

13. An organic EL display apparatus comprising:

a plurality of organic EL elements each including, in order, a first electrode, an organic EL layer, and a second electrode laminated on an optically transparent supporting substrate; and a display unit including a two-dimensional arrangement of said plurality of organic EL elements on said supporting substrate to define pixels, wherein, for each organic EL element, one of said first electrode and said second electrode is an optically transparent electrode, the other of said first electrode and said second electrode is a non-optically transparent electrode, said non-optically transparent electrode is disposed to only exist in part of each pixel as viewed from vertically above, no electrode for light-emitting except the non-optically transparent electrode is provided on a side of the organic EL layer on which the non-optically transparent electrode is disposed, a background of the display unit is observable through a portion within the pixel in which said non-optically transparent electrode is not disposed, said second electrode has a cross-sectional shape, the thickness of which is gradually reduced from the center toward both edges.

* * * * *